(12) United States Patent
Ku

(10) Patent No.: US 7,940,096 B2
(45) Date of Patent: May 10, 2011

(54) REGISTER CONTROLLED DELAY LOCKED LOOP CIRCUIT

(75) Inventor: Young-Jun Ku, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 124 days.

(21) Appl. No.: 12/337,562

(22) Filed: Dec. 17, 2008

(65) Prior Publication Data

US 2009/0256604 A1 Oct. 15, 2009

(30) Foreign Application Priority Data

Apr. 15, 2008 (KR) .................. 10-2008-0034607

(51) Int. Cl.
*H03L 7/06* (2006.01)
(52) U.S. Cl. .................. 327/158; 365/194; 365/233.11; 375/376; 327/261
(58) Field of Classification Search .................. 365/194, 365/233.11; 327/158, 261; 375/376
See application file for complete search history.

(56) References Cited

U.S. PATENT DOCUMENTS

| | | | |
|---|---|---|---|
| 6,943,602 B1 | 9/2005 | Lee et al. | |
| 6,985,401 B2 | 1/2006 | Jang et al. | |
| 6,987,408 B2 | 1/2006 | Kim et al. | |
| 6,995,591 B2 | 2/2006 | Lee et al. | |
| 7,103,133 B2 | 9/2006 | Jung et al. | |
| 7,391,247 B2* | 6/2008 | Millar | 327/172 |
| 2005/0195663 A1 | 9/2005 | Kwak | |

FOREIGN PATENT DOCUMENTS

| | | |
|---|---|---|
| JP | 2003-045183 | 2/2003 |
| JP | 2004-104747 | 4/2004 |
| JP | 2005-251368 | 9/2005 |
| JP | 2005-332548 | 12/2005 |
| KR | 1020010004252 A | 1/2001 |
| KR | 1020030049303 A | 6/2003 |
| KR | 100410632 B1 | 12/2003 |
| KR | 1020060000865 A | 1/2006 |

OTHER PUBLICATIONS

Notice of Allowance issued from Korean Intellectual Property Office on Aug. 26, 2009 with an Enligh Translation.

* cited by examiner

*Primary Examiner* — Hoai V Ho
*Assistant Examiner* — Fernando N Hidalgo
(74) *Attorney, Agent, or Firm* — IP & T Group LLP

(57) ABSTRACT

A register controlled DLL circuit occupies a relatively small area in a semiconductor device by reducing the number of flip-flops for generating timing pulses that are used to control a DLL operation and sequentially toggled. The registered controlled DLL circuit for generating a DLL clock by delaying internal clocks includes a timing pre-pulse generating unit configured to generate a plurality of timing pre-pulses activated sequentially in response to a source clock, the plurality of pre-pulses being repeated two or more times in each delay shifting update period, a mask signal generating unit configured to generating a mask signal having a logic level varied according to toggling of a predetermined one of the timing pre-pulses, and a timing pulse outputting unit configured to output the plurality of timing pre-pulses as a plurality of timing pulses in response to the mask signal.

13 Claims, 5 Drawing Sheets

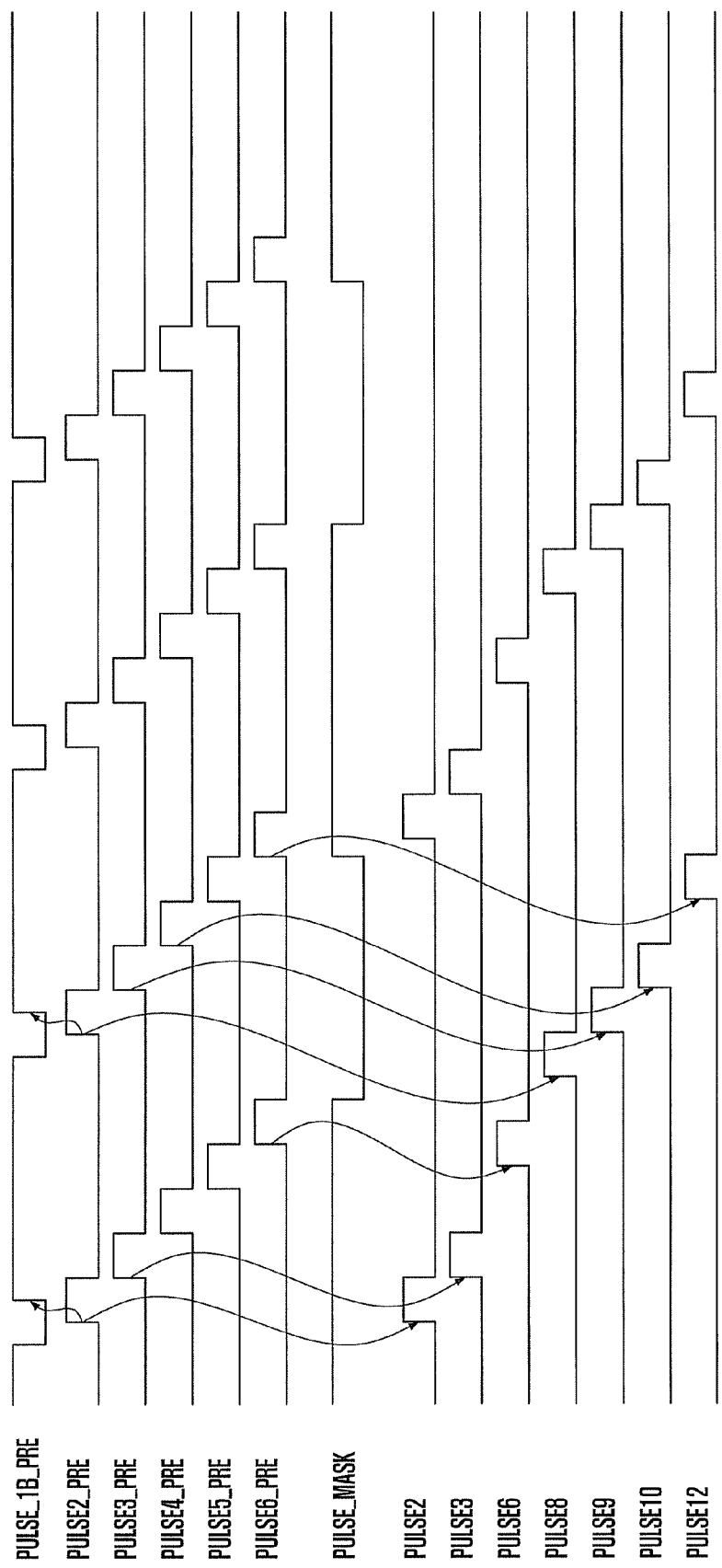

REGISTER CONTROLLED DELAY LOCKED LOOP CIRCUIT

CROSS-REFERENCE TO RELATED APPLICATION

The present invention claims priority of Korean patent application number 10-2008-0034607, filed on Apr. 15, 2008, which is incorporated by reference in its entirety.

BACKGROUND OF THE INVENTION

The present invention relates to a semiconductor design technology, and more particular, to a register controlled delay locked loop (DLL) circuit which occupies a relatively small area within a semiconductor device.

A synchronous semiconductor memory device such as a double data rate synchronous DRAM (DDR SDRAM) transfers data to external devices by using an internal clock synchronized with an external clock which is input from an external circuit such as a memory controller.

In order for a stable data transfer between the semiconductor memory device and the memory controller, a time synchronization should be achieved between an external clock, which is applied from the memory controller to the semiconductor memory device, and data, which is output from the semiconductor memory device. Herein, the data is output from the semiconductor memory device in synchronization with an internal clock. The internal clock is initially generated to be synchronized with the external clock. However, the internal clock becomes to be not synchronized with the external clock because it is delayed while passing through internal components of the semiconductor memory device.

Therefore, in order to stably transfer the data output from the semiconductor memory device, the internal clock which is delayed while passing through the internal components of the semiconductor memory device should be synchronized with the external clock by inversely compensating the time for loading the data on the bus to the internal clock.

To this end, a clock synchronization circuit such as a phase locked loop (PLL) circuit and a delay locked loop (DLL) circuit is used.

When the frequencies of the external clock and the internal clocks are different from each other, a PLL circuit is used because a frequency multiplication function is needed. On the other hand, when the frequencies of the external clock and the internal clock are equal to each other, a DLL circuit is used because it is not greatly influenced by noise and can be implemented in a relatively small area, compared with a PLL circuit.

In the case of the semiconductor memory device, since the frequencies of the external clock and the internal clock are equal to each other, the DLL circuit is used as the clock synchronization circuit.

In particular, a register controlled DLL circuit is widely used in the semiconductor memory device. The register controlled DLL circuit includes a register that can store a fixed delay value. When power is interrupted, the locked delay value is stored in the register, and then, when power is again supplied, the stored locked delay value is loaded and used to lock the internal clock. In this way, upon initial operation of the semiconductor memory device, a clock synchronization operation can be performed in a state where a phase difference between the internal clock and the external clock is relatively small. Furthermore, after the initial operation, the time taken to synchronize the internal clock with the external clock can be reduced by adjusting a variation width of the delay value, which is stored in the register according to the phase difference between the internal clock and the external clock.

FIG. 1 is a block diagram of a conventional register controlled DLL circuit.

Referring to FIG. 1, the conventional register controlled DLL circuit includes phase comparators 100R and 100F, a timing pulse generator 110, mode controllers 120R and 120F, delay shift controllers 130R and 130F, phase delay lines 140R and 140F, delay replica models 150R and 150F, a clock buffer 180B, a power-down mode controller 180A, a DLL controller 190, a pre-duty cycle corrector 160A, a duty cycle corrector 160B, and a DLL driver 170. The phase comparator 100R compares a phase of a source clock REFCLK with a phase of a feedback clock FBCLKR, and the phase comparator 100F compares a phase of the source clock REFCLK with a phase of a feedback clock FBCLKF.

The timing pulse generator 110 generates a plurality of timing pulses PULSE2, PULSE3, PULSE6, PULSE8, PULSE9, PULSE10 and PULSE12 sequentially enabled in each delay shifting update period in response to a control clock CONTCLK synchronized with the source clock REFCLK. The mode controllers 120R and 120F generate mode control signals FM_END, LOCK_STATE, FM_END_F and LOCK_STATEF corresponding to comparison results FINE, COARSE, FM_PDOUT, FINEF, COARSEF and FM_PDOUTF of the phase comparators 100R and 100F in response to the second timing pulse PULSE2 and the eighth timing pulse PULSE8 among the plurality of timing pulses PULSE2, PULSE3, PULSE6, PULSE8, PULSE9, PULSE10 and PULSE12.

The delay shift controllers 130R and 130F generate first delay shift control signals FRCLK_SL, FRCLK_SR, SRCLK_SL, SRCLK_SR, FFCLK_SL, FFCLK_SR, SFCLK_SL and SFCLK_SR for controlling the delay shifting operation in a normal mode and a fine adjusting mode, and second delay shift control signals FASTR_SL and FASTF_SL for controlling the delay shifting operation in a coarse adjusting mode, in response to the timing pulse PULSE3, PULSE6, PULSE9, PULSE10 or PULSE12 and the mode control signals FM_END, LOCK_STATE, FM_END_F or LOCK_STATEF. In response to the first delay shift control signals FRCLK_SL, FRCLK_SR, SRCLK_SL, SRCLK_SR, FFCLK_SL, FFCLK_SR, SFCLK_SL and SFCLK_SR, the phase delay lines 140R and 140F delay-shift phases of internal clocks CLKIN1 and CLKIN2 synchronized with the source clock REFCLK and toe control clock CONTCLK in units of delay unit in the normal mode and delay-shift phases of the internal clocks CLKIN1 and CLKIN2 in units smaller than the delay unit in the fine adjusting mode. The phase delay lines 140R and 140F delay-shift phases of the internal clocks CLKIN1 and CLKIN2, in units of delay group including a plurality of delay units, in response to the second delay shift control signals FASTR_SL and FASTF_SL in the coarse adjusting mode.

The delay replica models 150R and 150F receive output clocks IFBCLKR and IFBCLKF of the duty cycle corrector 160B, and output the feedback clocks FBCLKR and FBCLKF by reflecting actual delay conditions of an internal clock path. The clock buffer 180B buffers an external clock CLK to generate the source clock REFCLK, the control clock CONTCLK, and the internal clocks CLKIN1 and CLKIN2 having synchronized phases.

The power-down mode controller 180A generates a control signal CLKBUF_END for controlling the operation of the clock buffer 180B in response to an inverted clock enable signal CKEB_COM, a signal SAPB having power-down mode information of a mode register set (MRS), and a signal RASIDLE having precharge information. The DLL controller 190 generates a reset signal RESET for controlling an operation of the DLL circuit in response to a DLL reset signal DLL_RESETB and a DLL disable signal DIS_DLL input from the outside of the semiconductor memory device.

The pre-duty cycle corrector 160A inverts a phase of one of the output clocks MIXOUT_R and MIXOUT_F of the phase delay lines 140R and 140F, generally MIXOUT_F, to output a rising internal clock RISING_CLK and a falling internal clock FALLING_CLK. The rising internal clock RISING_CLK has a rising edge corresponding to a rising edge of the internal clocks CLKIN1 and CLKIN2. The falling internal clock FALLING_CLK has a rising edge corresponding to a falling edge of the internal clocks CLKIN1 and CLKIN2. The duty cycle corrector 160B corrects a duty cycle ratio of the rising internal clock RISING_CLK and the falling internal clock FALLING_CLK in a locked state to output a correction signals DCC_ENB. The DLL driver 170 outputs DLL clocks IRCLKDLL and IFCLKDLL by driving the output clocks IFBCLKR and IFBCLKF of the duty cycle corrector 160B.

An operation of the conventional register controlled DLL circuit will be described below.

The above-described register controlled DLL circuit is a DLL circuit that operates in a dual-loop scheme. The dual-loop scheme is to perform a DLL operation by using two clocks having opposite phases, and then perform a duty ratio correction operation when the clock is locked through the DLL operation, so that the duty ratio of the clock output through the DLL circuit can have 50:50.

That is, the dual-loop scheme is to perform the DLL operation by using the rising internal clock RISING_CLK having the rising edge corresponding to the rising edge of the internal clocks CLKIN1 and CLKIN2 and the falling internal clock FALLING_CLK having the rising edge corresponding to the falling edge of the internal clocks CLKIN1 and CLKIN2. As opposed to the dual-loop scheme, a single-loop scheme is to perform a DLL operation by using one clock corresponding to a rising or falling edge of the internal clocks CLKIN1 and CLKIN2 before a duty ratio correction operation, and perform the duty ratio correction operation when the clock is locked through the DLL operation.

Among the components of the DLL circuit, the mode controllers 120R and 120F, the phase comparators 100R and 100F, the delay shift controllers 130R and 130F, the phase delay lines 140R and 140F, and the delay replica models 150R and 150F are divided into two blocks having the same circuit configuration: a first block 100R, 120R, 130R, 140R and 150R for adjusting the phase of the rising internal clock RISING_CLK, and a second block 100F, 120F, 130F, 140F and 150F for adjusting the phase of the falling internal clock FALLING_CLK.

The first block 100R, 120R, 130R, 140R and 150R for controlling the phase of the rising internal clock RISING_CLK adjusts the phase of the rising internal clock RISING_CLK so that the rising edge of the rising internal clock RISING_CLK is synchronized with the rising edge of the source clock REFCLK before and even after the locked state. This is done for make the locked state before the clock is locked, and for compensating the variation in the phase of the rising clock RISING_CLK due to the variation of the external power supply voltage and the noise after the clock is locked.

The second block 100F, 120F, 130F, 140F and 150F for controlling the phase of the falling internal clock FALLING_CLK adjusts the phase of the falling internal clock FALLING_CLK so that the rising edge of the falling internal clock FALLING_CLK is synchronized with the rising edge of the source clock REFCLK before the locked state. However, after the locked state, some components 130F and 140F of the second block are operated while the other components 100F, 120F and 150F are not operated. This is done for make the locked state before the clock is locked. After the locked state, the duty cycle ratio is corrected by the duty cycle corrector 160B at the same time with the entry of the locked state, and thus, the variation of the phase of the falling internal clock FALLING_CLK does not influence the output of the DLL circuit.

In the typical dual-loop register controlled DLL circuit, the locked state means that the rising edges of the rising internal clock RISING_CLK and the falling internal clock FALLING_CLK are all synchronized with the source clock REFCLK within a predetermined error range.

FIG. 2 is a circuit diagram of the timing pulse generator in the conventional register controlled DLL circuit of FIG. 1.

That the last pulse of the timing pulses PULSE2, PULSE3, PULSE6, PULSE8, PULSE9, PULSE10 and PULSE12 generated from the timing pulse generator 110 is the twelfth timing pulse means that the delay shifting update period of the register controlled DLL circuit of FIG. 1 is a time 12$t$CK for which the external clock CLK toggles twelve times.

In addition, the timing pulses PULSE2, PULSE3, PULSE6, PULSE8, PULSE9, PULSE10 and PULSE12 are not generated in sequence from the first timing pulse to the twelfth timing pulse, because the conventional timing pulse generator 110 generates only the timing pulses to be actually input to the components of the DLL circuit and used to control the DLL operation.

However, the number of the timing pulses generated by the timing pulse generator 110 may be more than or less than twelve. That is, the delay shifting update period of the register controlled DLL circuit of FIG. 1 may be shorter than or longer than the time 12 tCK for which the external clock CLK toggles twelve times.

Referring to FIG. 2, the timing pulse generator 110 in the conventional register controlled DLL circuit of FIG. 1 includes a timing pre-pulse generating unit 112 and a timing pulse outputting unit 114. The timing pre-pulse generating unit 112 generates a plurality of timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE which toggle sequentially in response to the control clock CONTCLK synchronized with the source clock REFCLK. The timing pulse outputting unit 114 outputs the plurality of timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE as a plurality of timing pulses PULSE2, PULSE3, PULSE6, PULSE8, PULSE9, PULSE10 and PULSE12.

The timing pre-pulse generating unit 112 includes a timing pre-pulse outputting unit 1122 and an operation controlling unit 1124. The timing pre-pulse outputting unit 1122 outputs the timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE which toggle sequentially in response to the toggling of the control clock CONTCLK synchronized with the source clock CLK. The operation controlling unit 1124 controls the operation of the timing pre-pulse outputting unit 1122.

The timing pre-pulse outputting unit 1122 of the timing pre-pulse generating unit 112 toggles the other timing pre-pulses PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE in sequence whenever the control clock CONTCLK synchronized with the source clock REFCLK toggles after the toggling of the reference timing pulse PULSE_1B_PRE among the timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE.

That is, the timing pre-pulse outputting unit 1122 of the timing pre-pulse generating unit 112 includes a plurality of flip-flops 1122A, 1122B, 1122C, 1122D, 1122E, 1122F, 1122G, 1122H, 1122I, 1122J and 1122K which are connected in series to output the timing pre-pulses PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE through data output terminals D_OUT in response to the control clock CONTCLK, which is input to clock input terminals CLK_IN and synchronized with the source clock REFCLK, and the timing pre-pulse, which is activated at previous flip-lop and input through data input terminals D_IN.

The operation controlling unit 1124 of the timing pre-pulse generating unit 112 toggles the reference timing pre-pulse PULSE_1B_PRE when the activated timing pre-pulses PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE are all deactivated.

That is, the operation controlling unit 1124 activates the reference timing pre-pulse PULSE_1B_PRE when the activated timing pre-pulses PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE are all deactivated, and deactivates the reference timing pre-pulse PULSE_1B_PRE when at least one of the timing pre-pulses PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE is activated.

Therefore, the timing pre-pulse generating unit 112 toggles the timing pre-pulses PULSE2_PRE PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE in sequence in response to the toggling of the reference timing pre-pulse PULSE_1B_PRE, and again toggles the reference timing pulse PULSE_1B_PRE in response to the completion of the toggling of the activated timing pre-pulses PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE, so that the timing pre-pulses PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE can again be toggled in sequence.

That is, if the control clock CONTCLK synchronized with the source clock REFCLK is continuously toggled, the plurality of timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE continue to be toggled repetitively and sequentially.

The timing pulse outputting unit 114 receives predefined timing pre-pulses PULSE2_PRE, PULSE3_PRE, PULSE6_PRE, PULSE8_PRE, PULSE9_PRE, PULSE10_PRE and PULSE12_PRE among the sequentially toggling timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE, and outputs the timing pulses PULSE2, PULSE3, PULSE6, PULSE8, PULSE9, PULSE10 and PULSE12.

A criterion for selecting the predefined timing pre-pulses PULSE2_PRE, PULSE3_PRE, PULSE6_PRE, PULSE8_PRE, PULSE9_PRE, PULSE10_PRE, PULSE11_PRE and PULSE12_PRE is whether the timing pulses PULSE2, PULSE3, PULSE6, PULSE8, PULSE9, PULSE10 and PULSE12 generated corresponding to the predefined timing pre-pulses PULSE2_PRE, PULSE3_PRE, PULSE6_PRE, PULSE8_PRE, PULSE9_PRE, PULSE10_PRE, and PULSE12_PRE are a pulse used actually in the DLL circuit or not.

That is, all the timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE are not used to control the operation of the respective components of the DLL circuit, but only the predefined timing pre-pulses PULSE2_PRE, PULSE3_PRE, PULSE6_PRE, PULSE8_PRE, PULSE9_PRE, PULSE10_PRE and PULSE12_PRE are input to the respective components of the DLL circuit as the timing pulses PULSE2, PULSE3, PULSE6, PULSE8, PULSE9, PULSE10 and PULSE12.

However, the reason why the timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE are all generated although all of them are not used is that the one-time toggling time of the PULSE2, PULSE3, PULSE6, PULSE8, PULSE9, PULSE10 and PULSE12 should be equal to the one-time completion time of the delay shifting update period of the DLL circuit. For example, if the delay shifting update period of the DLL circuit is equal to twelve-time toggling time of the external clock CLK, the one-time toggling time of the timing pulses PULSE2, PULSE3, PULSE6, PULSE8, PULSE9, PULSE10 and PULSE12 should be equal to twelve-time toggling time of the external clock CLK. However, the number of the timing pulses PULSE2, PULSE3, PULSE6, PULSE8, PULSE9, PULSE10 and PULSE12 actually used in the DLL circuit is less than twelve, and the toggling timing of the timing pulses PULSE2, PULSE3, PULSE6, PULSE8, PULSE9, PULSE10 and PULSE12 is not regular. Thus, if only the timing pulses PULSE2, PULSE3, PULSE6, PULSE8, PULSE9, PULSE10 and PULSE12 are generated, it is difficult to match the accurate generation timing.

Therefore, the timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE sequentially toggling at constant intervals are first generated, and only the pulses that are actually necessary for the operation of the DLL circuit are selected and output as the timing pulses PULSE2, PULSE3, PULSE6, PULSE8, PULSE9, PULSE10 and PULSE12.

FIG. 3 is a toggling timing diagram of the predefined timing pulses generated according to the operation of the conventional timing pulse generator of FIG. 2.

Referring to FIG. 3, in a state that the reference timing pulse PULSE_1B_PRE, a low active signal, is activated to a logic low level, the timing pulse generator 110 deactivates the reference timing pulse PULSE_1B_PRE to a logic high level and toggles the other timing pre-pulses PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE in sequence, in response to the toggling of the control clock CONTCLK synchronized with the source clock REFCLK. And then, the timing pulses PULSE2, PULSE3, PULSE6, PULSE8, PULSE9, PULSE10 and PULSE12 corresponding to the predefined timing pre-pulses PULSE2_PRE, PULSE3_PRE, PULSE6_PRE, PULSE8_PRE, PULSE9_PRE, PULSE10_PRE and PULSE12_PRE among the sequentially toggling timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE and outputted.

It can be seen from the timing diagram that the timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE are sequentially toggled at constant intervals. This toggling is preformed in response to the toggling of the control clock CONTCLK (see FIG. 1) synchronized with the source clock REFCLK.

On the other hand, it can be seen that the timing pulses PULSE2, PULSE3, PULSE6, PULSE8, PULSE9, PULSE10 and PULSE12 are toggled at irregular intervals.

That is, the timing pulses PULSE2, PULSE3, PULSE6, PULSE8, PULSE9, PULSE10 and PULSE12, which are toggled at irregular intervals, are generated using the timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE, which are sequentially toggled at constant intervals.

As described above, the timing pulse generator 110 generates the timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE, and then selectively outputs the timing pulses PULSE2, PULSE3, PULSE6, PULSE8, PULSE9, PULSE10 and PULSE12 corresponding to the timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE.

In the operation of generating the timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE in FIG. 2, eleven flip-flops 1122A, 1122B, 1122C, 1122D, 1122E, 1122F, 1122G, 1122H, 1122I, 1122J and 1122K are used for generating the twelve timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE.

That is, it can be seen that eleven flip-flops 1122A, 1122B, 1122C, 1122D, 1122F, 1122G, 1122H, 1122I, 1122J and 1122K are used for generating the eleven timing pre-pulses PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE, except the reference timing pulse PULSE_1B_PRE whose activation is controlled by the operation controlling unit 1124.

Increasing the number of the flip-flops 1122A, 1122B, 1122C, 1122D, 1122E, 1122F, 1122G, 1122H, 1122I, 1122J and 1122K according to the number of the timing pre-pulses in order to generate the timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE, which are just sequentially toggled at constant intervals, is inefficient and increases a layout area of the semiconductor device.

In addition, in the semiconductor devices in which a toggling period (tCK) of the external clock CLK becomes shorter, the above problem may occur more frequently when the toggling number of the external clock CLK corresponding to the delay shifting update period increases.

For example, if the toggling number of the external clock CLK corresponding to the delay shifting update period of the DLL circuit is 24, that is, the delay shifting update period of the DLL circuit increases from the toggling time 12tCK, where the external clock CLK is toggled twelve times, to the toggling time 24tCK, where the external clock CLK is toggled twenty-four times, twenty-four timing pre-pulses are required and twenty-three flip-flops are required in the DLL circuit. Thus, the layout area of the DLL circuit increases in a semiconductor device where the toggling period tCK of the external clock CLK is relatively short.

In the operation of sequentially toggling the timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE in the conventional timing pulse generator 110, the reference timing pulse PULSE_1B_PRE is toggled and the remaining timing pre-pulses PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE are sequentially toggled. When the toggling of the other timing pre-pulses PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE is completed, it is detected and the reference timing pulse PULSE_1B_PRE is again toggled. In order to toggle the reference timing pulse PULSE_1B_PRE, such a scheme requires the operation of detecting if the other timing pre-pulses PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE are all deactivated.

That is, as illustrated in FIG. 2, whether the timing pre-pulses PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE are all deactivated or any one of the timing pre-pulses is activated can be detected with multiple stages of NAND gates NAND1 and NAND2 and NOR gates NOR1, NOR2, NOR3, NOR4 and NOR5.

The time taken until the multiple stages of the NAND gates NAND1 and NAND2 and the NOR gates NOR1, NOR2, NOR3, NOR4 and NOR5 determine a logic level of the reference timing pulse PULSE_1B_PRE in response to the timing pre-pulses PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE may cause a problem that the reference timing pulse PULSE_1B_REF does not toggle normally.

That is, the time until the reference timing pulse PULSE_1B_PRE is activated by detecting the last toggled timing pre-pulse PULSE12_PRE, and the time until the reference timing pulse PULSE_1B_PRE is deactivated in response to the second timing pre-pulse PULSE2_PRE starting to toggle according to the activation of the reference timing pulse PULSE_1B_PRE are the time for the pulses of passing through the multiple stages of the NAND gates NAND1 and NAND2 and the NOR gates NOR1, NOR2, NOR3, NOR4 and NOR5. Thus, when the last toggled timing pre-pulse PULSE12_PRE is deactivated, the reference timing pulse PULSE_1B_PRE is activated after the deactivated timing pre-pulse PULSE12_PRE should pass through the NAND gates NAND1 and NAND2 and the NOR gates NOR1, NOR2, NOR3, NOR4 and NOR 5. After the second timing pre-pulse PULSE2_PRE is toggled according to the activation of the reference timing pulse PULSE_1B_PRE, the reference timing pulse pulses PULSE_1B_PRE is not deactivated until the toggled second timing pre-pulse PULSE2_PRE passes through the NAND gates NAND1 and NAND2 and the NOR gates NOR1, NOR2, NOR3, NOR4 and NOR5.

Therefore, when the time of passing through the NAND gates NAND1 and NAND2 and the NOR gates NOR1, NOR2, NOR3, NOR4 and NOR5 is relatively longer than one period 1$t$CK of the external clock CLK, the timing when the activated reference timing pulse PULSE_1B_PRE is deactivated becomes later than the toggling timing of the control clock CONTCLK synchronized with the source clock REFCLK. Thus, the reference timing pulse PULSE_1B_PRE is deactivated later by one period 1$t$CK than the timing when it should be deactivated. Consequently, the reference timing pulse PULSE_1B_PRE that should have the activation period of 1 tCK has the activation period of 2 tCK.

In this case, the remaining timing pre-pulses PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE should have the same activation period as the reference timing pulse PULSE_1B_PRE. Thus, if the reference timing pulse PULSE_1B_PRE has the activation period of 2 tCK, the timing pre-pulses PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE will have the activation period of 2 tCK in response to the reference timing pulse PULSE_1B_PRE.

If the timing pre-pulses PULSE_1B_PRE, PULSE2_PRE, PULSE3_PRE, PULSE4_PRE, PULSE5_PRE, PULSE6_PRE, PULSE7_PRE, PULSE8_PRE, PULSE9_PRE, PULSE10_PRE, PULSE11_PRE and PULSE12_PRE have the activation period of 2 tCK, the corresponding timing pulses PULSE2, PULSE3, PULSE6, PULSE8, PULSE9, PULSE10 and PULSE12 have the activation period of 2 tCK and their activation periods may be overlapped with each other. Therefore, the operation timings of the respective components may be overlapped and thus the DLL circuit may not be operated normally.

In addition, the above-described problem may be caused more frequently with the increase of the toggling number of the external clock CLK corresponding to the delay shifting update period in the DLL circuit where the toggling period tCK of the external clock CLK is getting shorter.

For example, if the toggling number of the external clock CLK corresponding to the delay shifting update period of the DLL circuit increases from 12 tCK to 24 tCK, the operation timings of the respective components of the DLL circuit are overlapped, more frequently causing the problem that the DLL circuit is not operated normally.

SUMMARY OF THE INVENTION

Embodiments of the present invention are directed to providing a register controlled DLL circuit which occupies a relatively small area in a semiconductor device by reducing the number of flip-flops for generating timing pulses that are used to control a DLL operation and sequentially toggled.

In accordance with an aspect of the present invention, there is provided a registered controlled delay locked loop (DLL) circuit for generating a DLL clock by delaying internal clocks, which includes a timing pre-pulse generating unit configured to generate a plurality of timing pre-pulses activated sequentially in response to a source clock, the plurality of pre-pulses being repeated two or more times in each delay shifting update period, a mask signal generating unit configured to generating a mask signal having a logic level varied according to toggling of a predetermined one of the timing pre-pulses, and a timing pulse outputting unit configured to output the plurality of timing pre-pulses as a plurality of timing pulses in response to the mask signal.

In accordance with another aspect of the present invention, there is provided a semiconductor memory device, which includes a timing pulse generating unit configured to generate a plurality of timing pulses activated sequentially in each delay shifting update period in response to a source clock, a phase delay unit configured to compare a phase of the source clock with a phase of a feedback clock at a time point defined by the respective timing pulses, and delay a phase of an internal clock having an edge corresponding to that of the source clock according to a comparison result, and a delay replica model unit configured to reflect an actual delay condition of the internal clock path on an output signal of the phase delay unit to output the feedback clock.

BRIEF DESCRIPTION OF THE DRAWINGS

FIG. 5 is a toggling timing diagram of the predefined timing pulses generated according to the operation of the timing pulse generator of FIG. 4.

DESCRIPTION OF SPECIFIC EMBODIMENTS

Hereinafter, a register controlled DLL circuit in accordance with the present invention will be described in detail with reference to the accompanying drawings.

Figure 1:
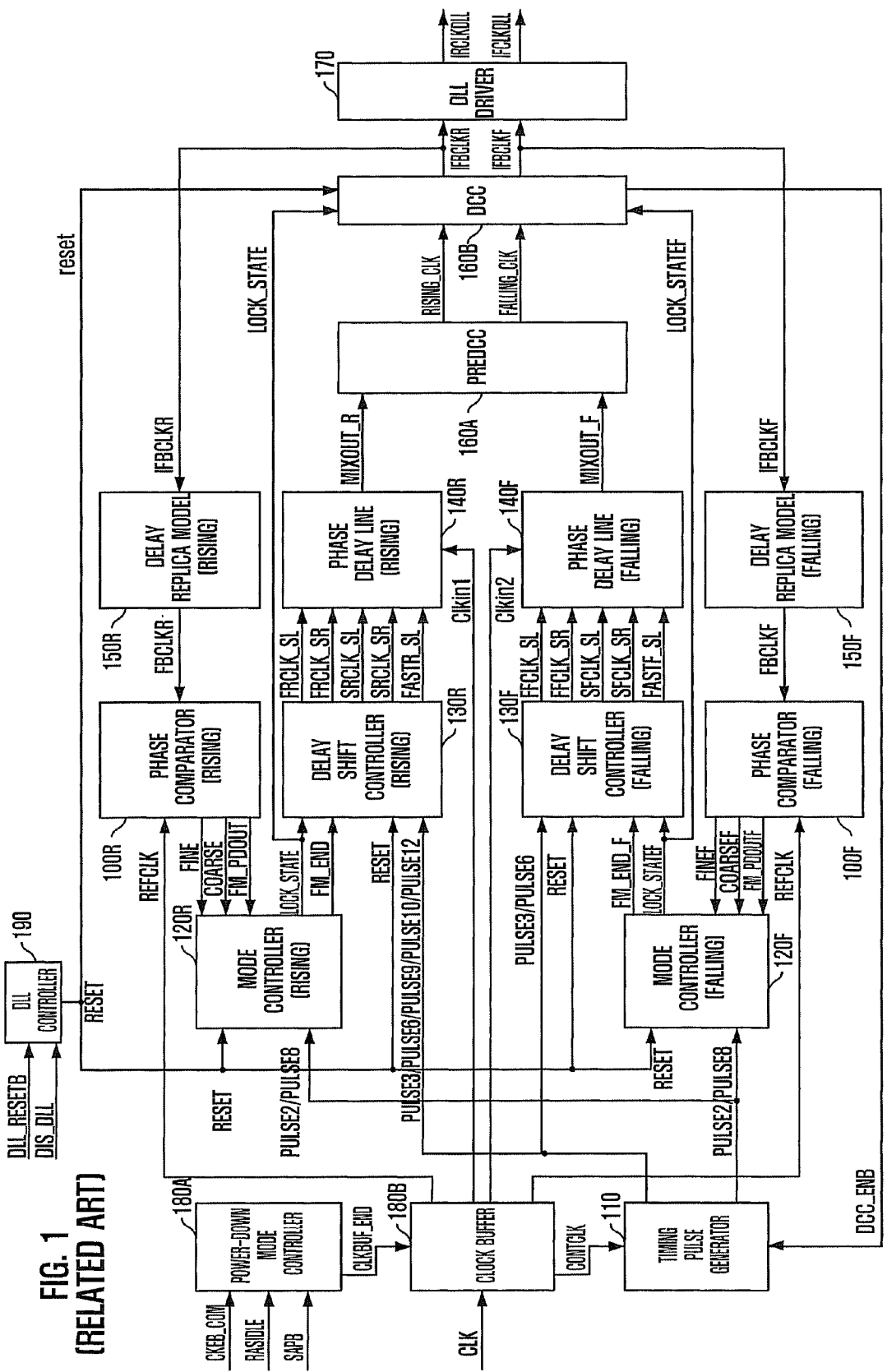
FIG. 1 is a block diagram of a conventional register controlled DLL circuit.
Figure 2:
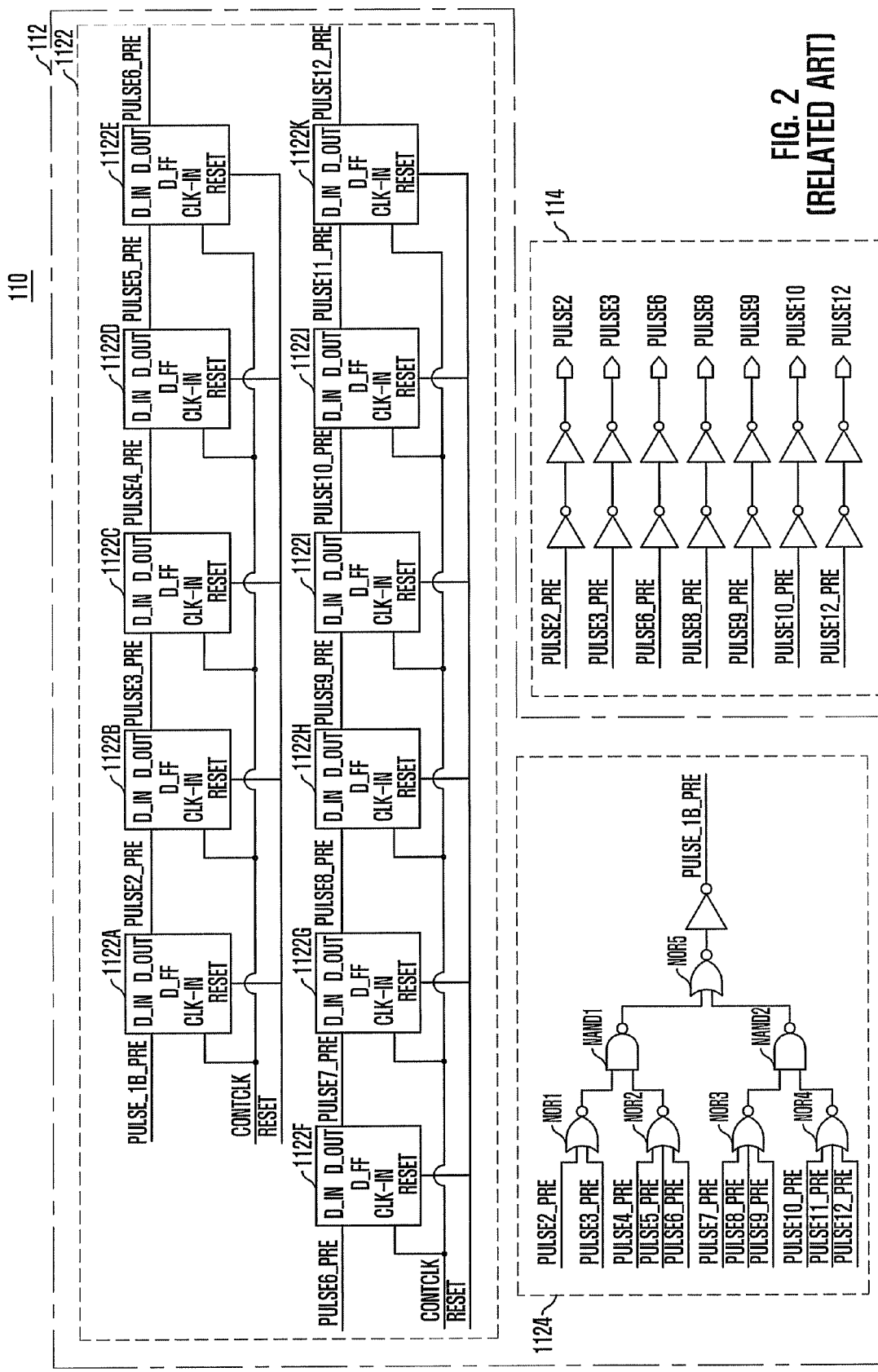
FIG. 2 is a circuit diagram of the timing pulse generator in the conventional register controlled DLL circuit of FIG. 1.
Figure 3:
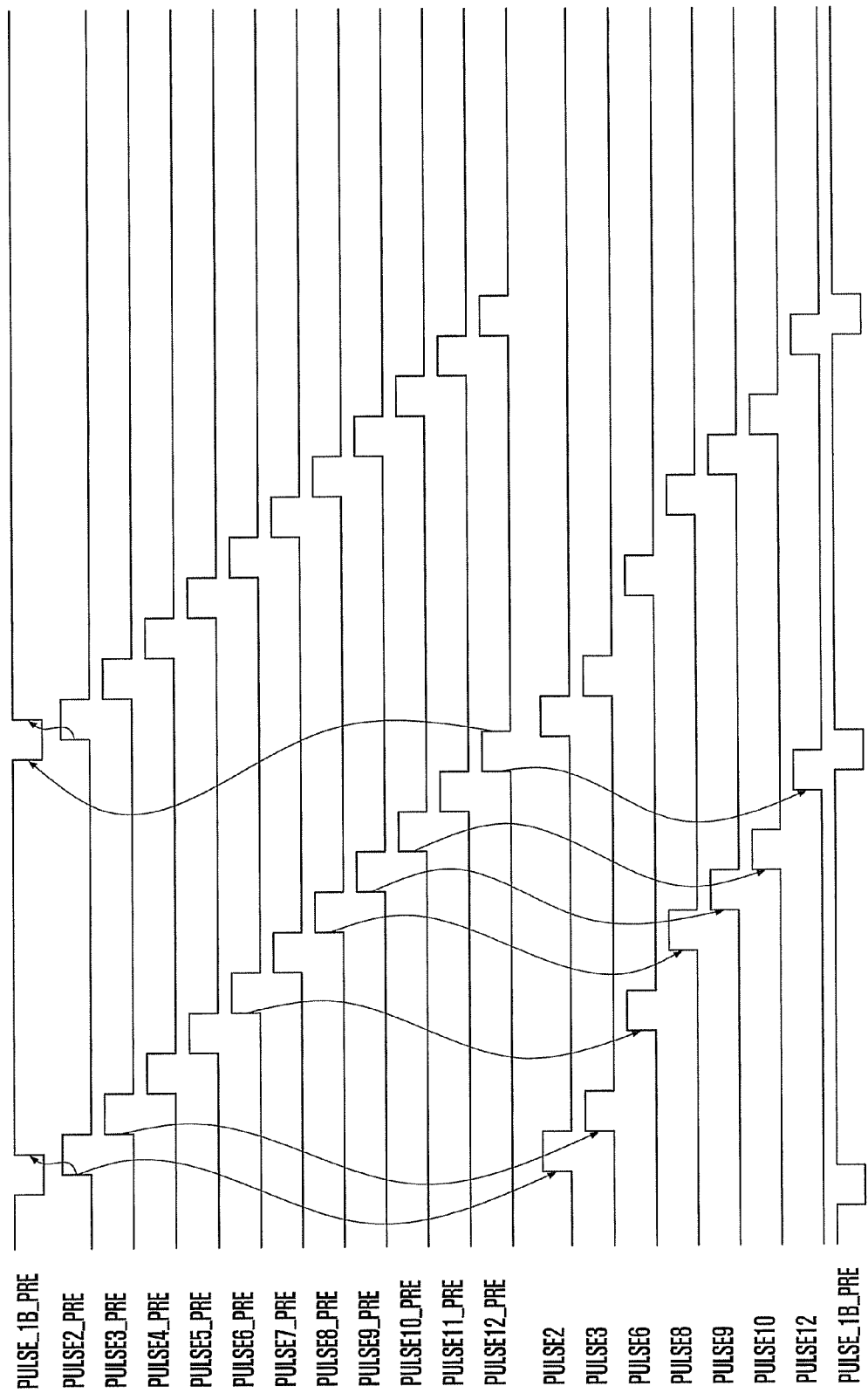
FIG. 3 is a toggling timing diagram of the predefined timing pulses generated according to the operation of the conventional timing pulse generator of FIG. 2.
Figure 4:
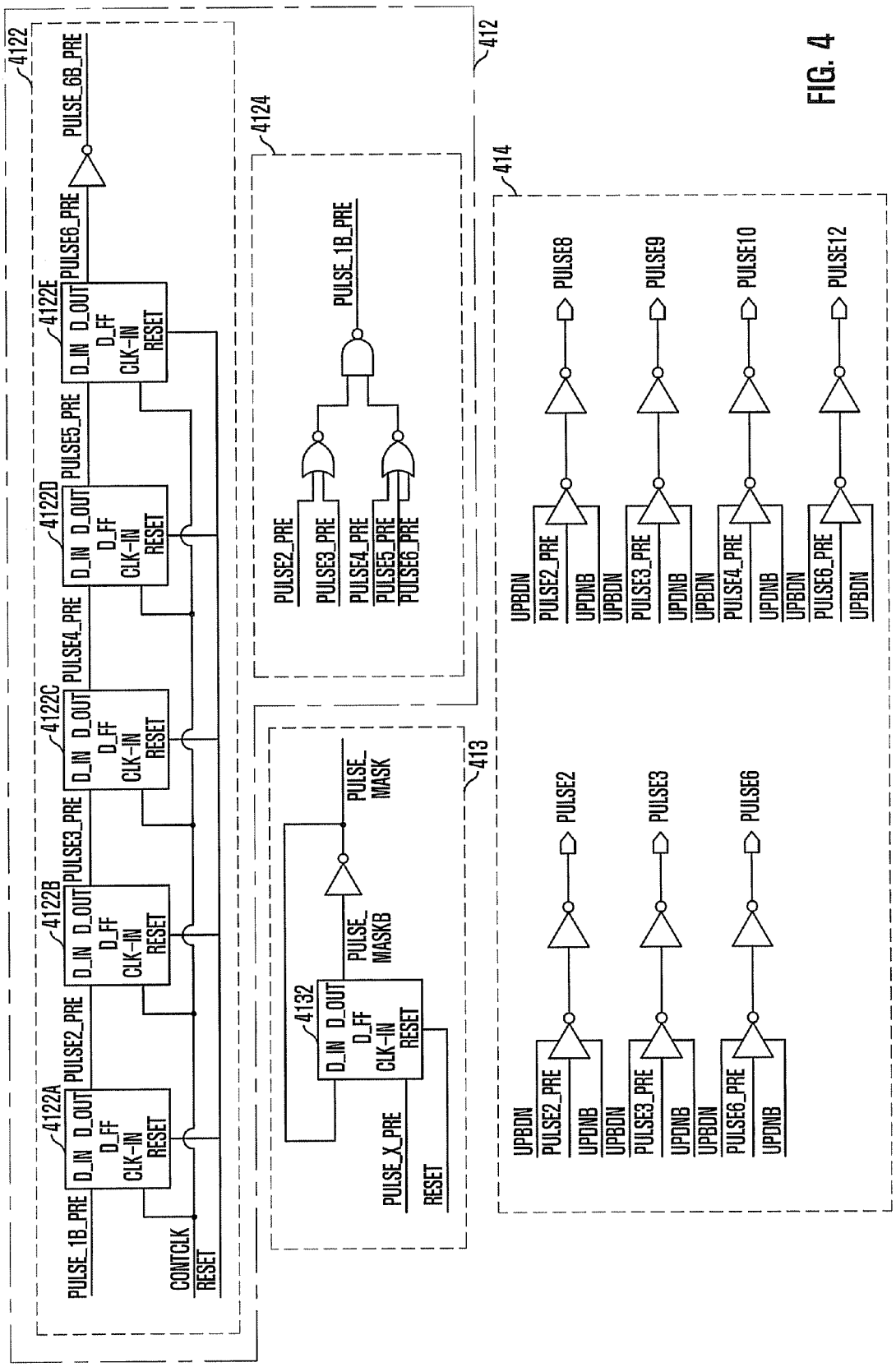
FIG. 4 is a circuit diagram of a timing pulse generator in a register controlled DLL circuit in accordance with an embodiment of the present invention.

FIG. 4 is a circuit diagram of a timing pulse generator in a register controlled DLL circuit in accordance with an embodiment of the present invention.

That the last pulse among a plurality of timing pulses PULSE2, PULSE3, PULSE6, PULSE8, PULSE9, PULSE10 and PULSE12 generated from the timing pulse generator is a twelfth timing pulse means that a delay shifting update period of the register controlled DLL circuit is 12 tCK, that is, a time for which an external clock CLK is toggles twelve times.

In addition, the reason why all the timing pulses from the first timing pulse to the twelfth timing pulse are not generated is that the timing pulse generator generates only the timing pulses to be actually input to the components of the DLL circuit and used to control the DLL operation.

However, the number of the timing pulses generated by the timing pulse generator may be more than or less than twelve. That is, the delay shifting update period of the register controlled DLL circuit may be shorter than or longer than the time 12tCK for which the external clock CLK toggles twelve times.

Referring to FIG. 4, the timing pulse generator in accordance with an embodiment of the present invention includes a timing pre-pulse generating unit 412, a mask signal generating unit 413, and a timing pulse outputting unit 414. The timing pre-pulse generating unit 412 generates a plurality of timing pre-pulses PULSE_1B_PRE, PULSE2_PRE, PULSE3_PRE, PULSE_4_PRE, PULSE5_PRE and PULSE6_PRE sequentially toggled in response to a control clock CONTCLK, which is synchronized with a source clock REFCLK, and repeated two or more times in each delay shifting update period. The mask signal generating unit 413 generates a mask signal PULSE_MASK whose logic level is varied according to the toggling of a predefined one of the timing pre-pulses PULSE_1B_PRE, PULSE2_PRE, PULSE3_PRE, PULSE4_PRE, PULSE5_PRE and PULSE6_PRE. The timing pulse outputting unit 414 outputs the timing pre-pulses PULSE_1B_PRE, PULSE2_PRE, PULSE3_PRE, PULSE4_PRE, PULSE5_PRE and PULSE6_PRE as a plurality of timing pulses PULSE2, PULSE3, PULSE6, PULSE8, PULSE9, PULSE10 and PULSE12 in response to the mask signal PULSE_MASK.

The timing pre-pulse generating unit 412 includes a timing pre-pulse outputting unit 4122, and an operation controlling unit 4124. The timing pre-pulse outputting unit 4122 outputs the timing pre-pulses PULSE_1B_PRE, PULSE2_PRE, PULSE3_PRE, PULSE4_PRE, PULSE5_PRE and PULSE6_PRE which toggle sequentially in response to the toggling of the control clock CONTCLK synchronized with the source clock REFCLK. The operation controlling unit 4124 controls the operation of the timing pre-pulse outputting unit 4122.

The timing pre-pulse outputting unit 4122 of the timing pre-pulse generating unit 412 toggles the timing pre-pulses PULSE2_PRE, PULSE3_PRE, PULSE4_PRE, PULSE5_PRE and PULSE6_PRE in sequence whenever the control clock CONTCLK synchronized with the source clock REFCLK toggles after the toggling of the reference timing pulse PULSE_1B_PRE among the timing pre-pulses PULSE_1B_PRE, PULSE2_PRE, PULSE3_PRE, PULSE4_PRE, PULSE5_PRE and PULSE6_PRE.

That is, the timing pre-pulse outputting unit 4122 of the timing pre-pulse generating unit 412 includes a plurality of flip-flops 4122A, 4122B, 4122C, 4122D and 4122E which are connected in series to output the second to sixth timing pre-pulses PULSE2_PRE, PULSE3_PRE, PULSE4_PRE, PULSE5_PRE and PULSE6_PRE through data output terminals D_OUT in response to the control clock CONTCLK, which is input to clock input terminals CLK_IN and synchronized with the source clock REFCLK, and the first to fifth timing pre-pulses PULSE_1B_PRE, PULSE2_PRE, PULSE3_PRE, PULSE4_PRE and PULSE5_PRE, which are activated at previous flip-flops and input through data input terminals D_IN.

The operation controlling unit 4124 of the timing pre-pulse generating unit 412 toggles the reference timing pre-pulse PULSE_1B_PRE when the timing pre-pulses PULSE2_PRE, PULSE3_PRE, PULSE4_PRE, PULSE5_PRE and PULSE6_PRE are all deactivated. Specifically, the operation controlling unit 4124 activates the reference timing pre-pulse PULSE_1B_PRE when the activated second to sixth timing pre-pulses PULSE2_PRE PULSE3_PRE, PULSE4_PRE, PULSE5_PRE and PULSE6_PRE are all deactivated, and deactivates the reference timing pre-pulse PULSE_1B_PRE when at least one of the second to sixth timing pre-pulses PULSE2_PRE PULSE3_PRE, PULSE4_PRE, PULSE5_PRE and PULSE6_PRE is activated.

Therefore, the timing pre-pulse generating unit 412 toggles the remaining timing pre-pulses PULSE2_PRE, PULSE3_PRE, PULSE4_PRE, PULSE5_PRE and PULSE6_PRE in sequence in response to the toggling of the reference timing pre-pulse PULSE_1B_PRE, and again toggles the reference timing pulse PULSE_1B_PRE in response to the completion of the toggling of the activated timing pre-pulses PULSE2_PRE, PULSE3_PRE, PULSE4_PRE, PULSE5_PRE and PULSE6_PRE, so that the timing pre-pulses PULSE2_PRE, PULSE3_PRE, PULSE4_PRE, PULSE5_PRE and PULSE6_PRE can again be toggled in sequence.

That is, the timing pre-pulse generating unit 412 sequentially toggles the second to sixth timing pre-pulses PULSE2_PRE, PULSE3_PRE, PULSE4_PRE, PULSE5_PRE and PULSE6_PRE in response to the toggling of the first timing pulse PULSE_1B_PRE, and again toggles the first timing pulse PULSE_1B_PRE in response to the completion of the toggling of the activated second to sixth timing pre-pulses PULSE2_PRE, PULSE3_PRE, PULSE4_PRE, PULSE5_PRE and PULSE6_PRE, so that the second to sixth timing pre-pulses PULSE2_PRE PULSE3_PRE, PULSE4_PRE, PULSE5_PRE and PULSE6_PRE can again be toggled in sequence.

Consequently, if the control clock CONTCLK synchronized with the source clock REFCLK is continuously toggled, the timing pre-pulse generating unit 412 can continue to repetitively and sequentially toggle the plurality of timing pre-pulses PULSE_1B_PRE, PULSE2_PRE, PULSE3_PRE, PULSE4_PRE, PULSE5_PRE and PULSE6_PRE in response to the toggling of the control clock CONTCLK.

The mask signal generating unit 413 changes a logic level of the mask signal PULSE_MASK in response to the toggling of one of the timing pre-pulses PULSE_1B_PRE, PULSE2_PRE, PULSE3_PRE, PULSE4_PRE, PULSE5_PRE and PULSE6_PRE. Specifically, the mask signal generating unit 413 includes a flip-flop 4132 configured to output an inversion mask signal PULSE_MASKB through a data output terminal D_OUT in response to one of the timing pre-pulses PULSE_1B_PRE, PULSE2_PRE, PULSE3_PRE, PULSE4_PRE, PULSE5_PRE and PULSE6_PRE, which are input through a clock input terminal CLK_IN, and the mask signal PULSE_MASK, which is input through a data input terminal D_IN.

For example, the mask signal generating unit 413 changes the mask signal PULSE_MASK to a logic high level in response to the toggling of the sixth timing pre-pulse PULSE6_PRE when the mask signal PULSE_MASK is at a logic low level, and changes the mask signal PULSE_MASK to a logic low level in response to the toggling of the sixth timing pre-pulse PULSE6_PRE when the mask signal PULSE_MASK is at a logic high level.

The timing pulse outputting unit 414 outputs the timing pre-pulses PULSE2_PRE, PULSE3_PRE and PULSE6_PRE selected in a predefined order among the timing pre-pulses PULSE_1B_PRE, PULSE2_PRE, PULSE3_PRE, PULSE4_PRE, PULSE5_PRE and PULSE6_PRE as the timing pulses PULSE2, PULSE3 and PULSE6 of the predefined order in the activation period of the mask signal PULSE_MASK.

For example, the timing pulse outputting unit 414 outputs the second, third and sixth timing pre-pulses PULSE2_PRE PULSE3_PRE and PULSE6_PRE selected in a predefined order among the timing pre-pulses PULSE_1B_PRE, PULSE2_PRE, PULSE3_PRE, PULSE4_PRE, PULSE5_PRE and PULSE6_PRE as the second, third and sixth timing pulses PULSE2, PULSE3 and PULSE6 of the predefined order in the logic-high activation period of the mask signal PULSE_MASK.

In addition, in the deactivation period of the mask signal PULSE_MASK, the timing pulse outputting unit 414 receives the timing pre-pulses PULSE2_PRE, PULSE3_PRE, PULSE4_PRE and PULSE6_PRE selected in a predefined order among the timing pre-pulses PULSE_1B_PRE, PULSE2_PRE, PULSE3_PRE, PULSE4_PRE, PULSE5_PRE and PULSE6_PRE and outputs the timing pulses PULSE8, PULSE9, PULSE10 and PULSE12 in an order delayed by the mask signal PULSE_MASK compared to the predefined order.

For example, the timing pulse outputting unit 414 receives the second, third, fourth and sixth timing pre-pulses PULSE2_PRE, PULSE3_PRE, PULSE4_PRE and PULSE6_PRE selected in a predefined order among the timing pre-pulses PULSE_1B_PRE, PULSE2_PRE, PULSE3_PRE, PULSE4_PRE, PULSE5_PRE and PULSE6_PRE in the logic-low deactivation period of the mask signal PULSE_MASK, and outputs the eighth, ninth, tenth and twelfth timing pulses PULSE8, PULSE9, PULSE10 and PULSE12 in an order delayed by the mask signal PULSE_MASK compared to the predefined order, where the order is delayed by the order of 6 if the logic level of the mask signal PULSE_MASK is changed in response to the toggling of the sixth timing pre-pulse PULSE6_PRE.

Consequently, in the timing pulse outputting unit 414, the timing pre-pulses PULSE_1B_PRE, PULSE2_PRE, PULSE3_PRE, PULSE4_PRE, PULSE5_PRE and PULSE6_PRE are repeated two times, based on the logic level of the mask signal PULSE_MASK, in each delay shifting update period of the register controlled DLL circuit. Thus, even when the timing pre-pulses selected in the predefined order among the timing pre-pulses PULSE_1B_PRE, PULSE2_PRE, PULSE3_PRE, PULSE4_PRE, PULSE5_PRE and PULSE6_PRE are identical to one another, the timing pulses output according to the mask signal PULSE_MASK may be different.

For example, the second and third timing pre-pulses PULSE2_PRE and PULSE3_PRE selected in the predefined order among the timing pre-pulses PULSE_1B_PRE, PULSE2_PRE, PULSE3_PRE, PULSE4_PRE, PULSE5_PRE and PULSE6_PRE are output as the second and third timing pulses PULSE2 and PULSE3 when the mask signal PULSE_MASK is activated to a logic high level. However, when the mask signal PULSE_MASK is deactivated to a logic low level, the eighth and ninth timing pulses PULSE8 and PULSE9 are output.

A criterion for selecting the timing pre-pulses PULSE2_PRE, PULSE3_PRE and PULSE6_PRE, or PULSE2_PRE, PULSE3_PRE, PULSE4_PRE and PULSE6_PRE in the predefined order among the timing pre-pulses PULSE_1B_PRE, PULSE2_PRE, PULSE3_PRE, PULSE4_PRE, PULSE5_PRE and PULSE6_PRE is whether the timing pulses PULSE2, PULSE3 and PULSE6, or PULSE8, PULSE9, PULSE10 and PULSE12 generated corresponding to the timing pre-pulses PULSE2_PRE, PULSE3_PRE and PULSE6_PRE, or PULSE2_PRE, PULSE3_PRE, PULSE4_PRE and PULSE6_PRE selected in the predefined order are pulses used actually in the DLL circuit or not.

That is, all the timing pulses PULSE1, PULSE2, PULSE3, PULSE4, PULSE5 and PULSE6, or PULSE7, PULSE8, PULSE9, PULSE10, PULSE11 and PULSE12 generated in response to the timing pre-pulses PULSE_1B_PRE, PULSE2_PRE, PULSE3_PRE, PULSE4_PRE, PULSE5_PRE and PULSE6_PRE and the mask signal PULSE_MASK are not used to control the operation of the respective components of the DLL circuit, but only the predefined timing pulses PULSE2, PULSE3 and PULSE6, or PULSE8, PULSE9, PULSE10 and PULSE12_PRE generated in response to the predefined timing pre-pulses PULSE2_PRE, PULSE3_PRE and PULSE6_PRE or PULSE2_PRE, PULSE3_PRE, PULSE4_PRE and PULSE6_PRE are input to the respective components of the DLL circuit.

However, the reason why the timing pre-pulses PULSE_1B_PRE, PULSE2_PRE, PULSE3_PRE, PULSE4_PRE, PULSE5_PRE and PULSE6_PRE are all generated although all of them are not used—only the second to fourth timing pre-pulses PULSE2_PRE, PULSE3_PRE and PULSE4_PRE and the sixth timing pre-pulse PULSE6_PRE are actually used—is that the one-time toggling time of the timing pulses PULSE2, PULSE3 and PULSE6, or PULSE8, PULSE9, PULSE10 and PULSE12 should be equal to the one-time completion time of the delay shifting update period of the DLL circuit. For example, if the delay shifting update period of the DLL circuit is equal to twelve-time toggling time of the external clock CLK, the one-time toggling time of the timing pulses PULSE2, PULSE3 and PULSE6, or PULSE8, PULSE9, PULSE10 and PULSE12 should be equal to twelve-time toggling time of the external clock CLK. However, the number of the timing pulses PULSE2, PULSE3 and PULSE6, or PULSE8, PULSE9, PULSE10 and PULSE12 actually used in the DLL circuit is less than twelve, and the toggling timing of the timing pulses PULSE2, PULSE3 and PULSE6, or PULSE8, PULSE9, PULSE10 and PULSE12 is not regular. Thus, if only the timing pre-pulses to be used are generated, it is difficult to match the accurate generation timing.

Therefore, the timing pre-pulses PULSE_1B_PRE, PULSE2_PRE, PULSE3_PRE, PULSE4_PRE, PULSE5_PRE and PULSE6_PRE sequentially toggling at constant intervals are first generated, and only the pulses PULSE2_PRE, PULSE3_PRE and PULSE6_PRE, or PULSE2_PRE, PULSE3_PRE, PULSE4_PRE and PULSE6_PRE that are actually necessary for the operation of the DLL circuit are selected and output as the timing pulses PULSE2, PULSE3 and PULSE6, or PULSE8, PULSE9, PULSE10 and PULSE12.

FIG. 5 is a toggling timing diagram of the predefined timing pulses generated according to the operation of the timing pulse generator of FIG. 4.

Referring to FIG. 5, in a state that the reference timing pulse PULSE_1B_PRE, a low active signal, is activated to a logic low level, the timing pulse generator 410 deactivates the reference timing pulse PULSE_1B_PRE to a logic high level and toggles the timing pre-pulses PULSE2_PRE, PULSE3_PRE, PULSE4_PRE, PULSE5_PRE and PULSE6_PRE in sequence, in response to the toggling of the control clock CONTCLK synchronized with the source clock REFCLK. And then, the timing pulses PULSE2, PULSE3 and PULSE6, or PULSE8, PULSE9, PULSE10 and PULSE12 corresponding to the predefined timing pre-pulses PULSE2_PRE, PULSE3_PRE and PULSE6_PRE, or PULSE2_PRE, PULSE3_PRE, PULSE4_PRE and PULSE6_PRE among the sequentially toggling timing pre-pulses PULSE_1B_PRE, PULSE2_PRE, PULSE3_PRE, PULSE4_PRE, PULSE5_PRE and PULSE6_PRE are outputted.

Specifically, it can be seen from the timing diagram that the timing pre-pulses PULSE2_PRE, PULSE3_PRE, PULSE4_PRE, PULSE5_PRE and PULSE6_PRE are sequentially toggled with the deactivation to a logic high level of the reference timing pulse PULSE_1B_PRE in an active state of a logic low level. And then the reference timing pulse PULSE_1B_PRE is again toggled in response to the deactivation of the timing pre-pulses PULSE2_PRE, PULSE3_PRE, PULSE4_PRE, PULSE5_PRE and PULSE6_PRE to a logic low level.

That is, it can be seen that the timing pre-pulses PULSE_1B_PRE, PULSE2_PRE, PULSE3_PRE, PULSE4_PRE, PULSE5_PRE and PULSE6_PRE are toggled sequentially and repetitively.

As illustrated, if the one-time completion time of the delay shifting update period of the register controlled DLL circuit in accordance with the embodiment of the present invention is identical to 12 tCK, that is, the twelve-time toggling time of the external clock CLK, the timing pre-pulses PULSE_1B_PRE, PULSE2_PRE, PULSE3_PRE, PULSE4_PRE, PULSE5_PRE and PULSE6_PRE must be toggled two times in order to reach one delay shifting update period of the register controlled DLL circuit, because the number of the timing pre-pulses PULSE_1B_PRE, PULSE2_PULSE, PULSE3_PRE, PULSE4_PRE, PULSE5_PRE and PULSE6_PRE is six.

If the mask signal PULSE_MASK is activated to a logic high level when the timing pre-pulses PULSE_1B_PRE, PULSE2_PRE, PULSE3_PRE, PULSE4_PRE, PULSE5_PRE and PULSE6_PRE are toggled in sequence, the timing pre-pulses PULSE2_PRE, PULSE3_PRE and PULSE6_PRE selected in the predefined order among the timing pre-pulses PULSE_1B_PRE, PULSE2_PRE, PULSE3_PRE, PULSE4_PRE, PULSE5_PRE and PULSE6_PRE are output as the timing pulses PULSE2, PULSE3 and PULSE6 in the predefined order.

In addition, if the mask signal PULSE_MASK is deactivated to a logic low level when the timing pre-pulses PULSE_1B_PRE, PULSE2_PRE, PULSE3_PRE, PULSE4_PRE, PULSE5_PRE and PULSE6_PRE are sequentially toggled, the timing pre-pulses PULSE2_PRE, PULSE3_PRE, PULSE4_PRE and PULSE6_PRE selected in the predefined order among the timing pre-pulses PULSE_1B_PRE, PULSE2_PRE, PULSE3_PRE, PULSE4_PRE, PULSE5_PRE and PULSE6_PRE are output as the eighth to tenth timing pulses PULSE8, PULSE9 and PULSE10 and the twelfth timing pulse PULSE12 in an order delayed by the mask signal PULSE_MASK compared to the predefined order the second to fourth timing pulses PULSE2, PULSE3 and PULSE4 and the sixth timing pulse PULSE6-, where the order is delayed by the order of 6 if the logic level of the mask signal PULSE_MASK is changed in response to the toggling of the sixth timing pre-pulse PULSE6_PRE.

Herein, it can be seen that the timing pre-pulses PULSE_1B_PRE, PULSE2_PRE, PULSE3_PRE, PULSE4_PRE, PULSE5_PRE and PULSE6_PRE are sequentially toggled at constant intervals in response to the toggling of the control clock CONTCLK synchronized with the source clock REFCLK. On the other hand, it can be seen that the timing pulses PULSE2, PULSE3 and PULSE6, or PULSE8, PULSE9, PULSE10 and PULSE12 are toggled at irregular intervals.

That is, the timing pulses PULSE2, PULSE3 and PULSE6, or PULSE8, PULSE9, PULSE10 and PULSE12, which are toggled at predefined irregular intervals, are generated using the timing pre-pulses PULSE_1B_PRE, PULSE2_PRE, PULSE3_PRE, PULSE4_PRE, PULSE5_PRE and PULSE6_PRE, which are sequentially toggled at constant intervals.

As described above, by outputting the sequentially toggling timing pre-pulses PULSE_1B_PRE, PULSE2_PRE, PULSE3_PRE, PULSE4_PRE, PULSE5_PRE and PULSE6_PER as the timing pulses PULSE2, PULSE3 and PULSE6, and the timing pulses PULSE8, PULSE9, PULSE10 and PULSE12, different from each other, in response to the mask signal PULSE_MASK, a relatively large number of timing pulses PULSE2, PULSE3 and PULSE6, or PULSE8, PULSE9, PULSE10 and PULSE12 can be generated using a relatively small number of timing pre-pulses PULSE_1B_PRE, PULSE2_PRE, PULSE3_PRE, PULSE4_PRE, PULSE5_PRE and PULSE6_PRE.

That is, it is possible to reduce the number of the flip-lops used for generating the timing pre-pulses PULSE_1B_PRE, PULSE2_PRE, PULSE3_PRE, PULSE4_PRE, PULSE5_PRE and PULSE6_PRE. That is, it is possible to reduce the circuit area of the register controlled DLL circuit in the semiconductor device.

The reduction in the total number of the timing pre-pulses PULSE_1B_PRE, PULSE2_PRE, PULSE3_PRE, PULSE4_PRE, PULSE5_PRE and PULSE6_PRE makes it possible to simplify the circuit that detects whether all the timing pre-pulses PULSE2_PRE, PULSE3_PRE, PULSE4_PRE, PULSE5_PRE and PULSE6_PRE other than the reference pulse PULSE_1B_PRE are deactivated, or one of them is activated. Therefore, the register controlled DLL circuit in accordance with the embodiment of the present invention can significantly reduce the probability that will cause the abnormal operation of the DLL circuit because the reference pulse PULSE_1B_PRE does not have a normal activation period in the register controlled DLL circuit.

Therefore, when generating the timing pulses used to control the DLL operation and sequentially toggled, the timing pulses are generated by masking based on the toggling of the predefined timing pulses, thereby reducing the number of the flip-flops used for generating the timing pulses. That is, the circuit area of the register controlled DLL circuit can be reduced.

While the present invention has been described with respect to the specific embodiments, it will be apparent to those skilled in the art that various changes and modifications may be made without departing from the spirit and scope of the invention as defined in the following claims. The positions and kinds of the logic gates exemplified in the above embodiments may be implemented differently according to the polarities of the input signals.

What is claimed is:

1. A register controlled delay locked loop (DLL) circuit for generating a DLL clock by delaying internal clocks, comprising:
   a timing pre-pulse generating unit configured to generate a plurality of timing pre-pulses activated sequentially in response to a source clock;
   a mask signal generating unit configured to generate a mask signal having a logic level that varies according to a toggling of a predetermined one of the timing pre-pulses; and
   a timing pulse outputting unit configured to select timing pre-pulses from among the plurality of timing pre-pulses, and to output the selected timing pre-pulses as a plurality of timing pulses in response to the mask signal,
   wherein each of the timing pre-pulses are activated two or more times in a delay shifting update period, which is a duration of time defined by a last pulse among the plurality of timing pulses.

2. The register controlled DLL circuit as recited in claim 1, wherein the internal clocks are delayed in the delay shifting update period.

3. The register controlled DLL circuit as recited in claim 1, wherein edges of internal clocks correspond to edges of the source clock.

4. The register controlled DLL circuit as recited in claim 1, wherein the timing pre-pulse generating unit includes:
   a timing pre-pulse outputting unit configured to output the plurality of timing pre-pulses toggling sequentially in response to toggling of the source clock; and
   an operation controlling unit configured to repeat operation of the timing pre-pulse outputting unit.

5. The register controlled DLL circuit as recited in claim 4, wherein the timing pre-pulse outputting unit sequentially toggles the timing pre-pulses other than a reference timing pre-pulse whenever the source clock is toggled after the toggling of the reference timing pre-pulse among the plurality of timing pre-pulses.

6. The register controlled DLL circuit as recited in claim 5, wherein the operation controlling unit toggles the reference timing pre-pulse in response to the deactivation of the plurality of timing pre-pulses.

7. The register controlled DLL circuit as recited in claim 4, wherein the timing pre-pulse generating unit generates first to sixth timing pre-pulses sequentially activated two times corresponding to first to twelfth timing pulses sequentially activated one time in the delay shifting update period in response to the source clock.

8. The register controlled DLL circuit as recited in claim 7, wherein the timing pre-pulse outputting unit sequentially toggles the second to sixth timing pre-pulses whenever the source clock is toggled after the toggling of the first timing pre-pulse.

9. The register controlled DLL circuit as recited in claim 8, wherein the operation controlling unit toggles the first timing pre-pulse in response to deactivation of the first to sixth timing pre-pulses.

10. The register controlled DLL circuit as recited in claim 1, wherein the mask signal generating unit generates the mask signal having a logic level that varies in response to a last toggling timing pre-pulse among the plurality of timing pre-pulses.

11. The register controlled DLL circuit as recited in claim 7, wherein the mask signal generating unit generates the mask signal having a logic level that varies in response to the toggling of the sixth timing pre-pulse.

12. The register controlled DLL circuit as recited in claim 1, wherein the timing pulse outputting unit receives the timing pre-pulses selected in a predetermined order among the plurality of timing pre-pulses and outputs the timing pulses in the predetermined order when the mask signal is activated.

13. The register controlled DLL circuit as recited in claim 12, wherein the timing pulse generating unit receives the timing pre-pulses selected in a predetermined order among the plurality of timing pre-pulses and outputs the timing pulses in an order delayed by the mask signal compared to the predetermined order when the mask signal is deactivated.

* * * * *